United States Patent
Ikeda

(10) Patent No.: US 7,795,971 B2
(45) Date of Patent: Sep. 14, 2010

(54) ELECTRONIC CIRCUIT AND ELECTRONIC DEVICE

(75) Inventor: Masayuki Ikeda, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 12/428,219

(22) Filed: Apr. 22, 2009

(65) Prior Publication Data

US 2009/0278600 A1  Nov. 12, 2009

(30) Foreign Application Priority Data

May 8, 2008 (JP) ............................. 2008-121929
Mar. 18, 2009 (JP) ............................. 2009-066742

(51) Int. Cl.
*H03F 3/45* (2006.01)

(52) U.S. Cl. ....................................... 330/253; 330/261

(58) Field of Classification Search ................. 330/253, 330/259, 260, 261
See application file for complete search history.

(56) References Cited

U.S. PATENT DOCUMENTS 6,724,258 B1 * 4/2004 Fayed .......................... 330/260
7,205,839 B2 * 4/2007 Luo et al. ..................... 330/258
2003/0058047 A1 * 3/2003 Sakurai ......................... 330/253

FOREIGN PATENT DOCUMENTS

| JP | A-4-170807 | 6/1992 |
| JP | A-5-22946 | 1/1993 |
| JP | A-5-115179 | 5/1993 |
| JP | A-11-215831 | 8/1999 |
| JP | A-2004-320083 | 11/2004 |
| JP | A-2005-252740 | 9/2005 |
| JP | A-2007-295377 | 11/2007 |

* cited by examiner

*Primary Examiner*—Henry K Choe
(74) *Attorney, Agent, or Firm*—Oliff & Berridge, PLC

(57) ABSTRACT

An electronic circuit includes: a first amplifying circuit to which a first input signal is inputted; a second amplifying circuit to which a second input signal is inputted; a first drain ground amplifying transistor provided between a first power source node and an output node with control over the gate by the output from the first amplifying circuit; a second drain ground amplifying transistor provided between the first power source node and the output node with control over the gate by the output from the second amplifying circuit; a common load element provided between the output node and a second power source node; a first negative feedback path for negative feedback from the output node to the input of the first amplifying circuit; and a second negative feedback path for negative feedback from the output node to the input of the second amplifying circuit.

8 Claims, 10 Drawing Sheets

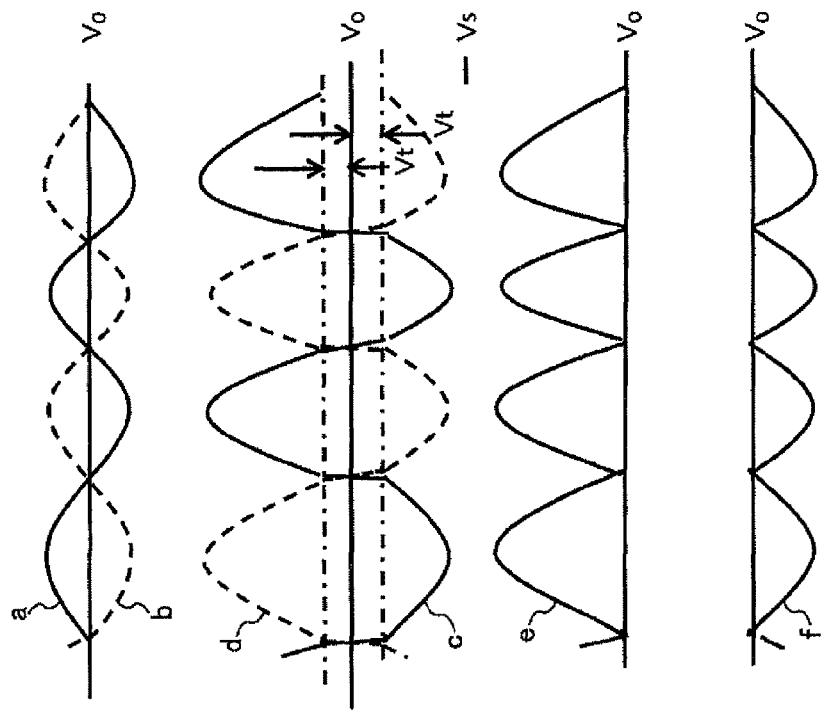
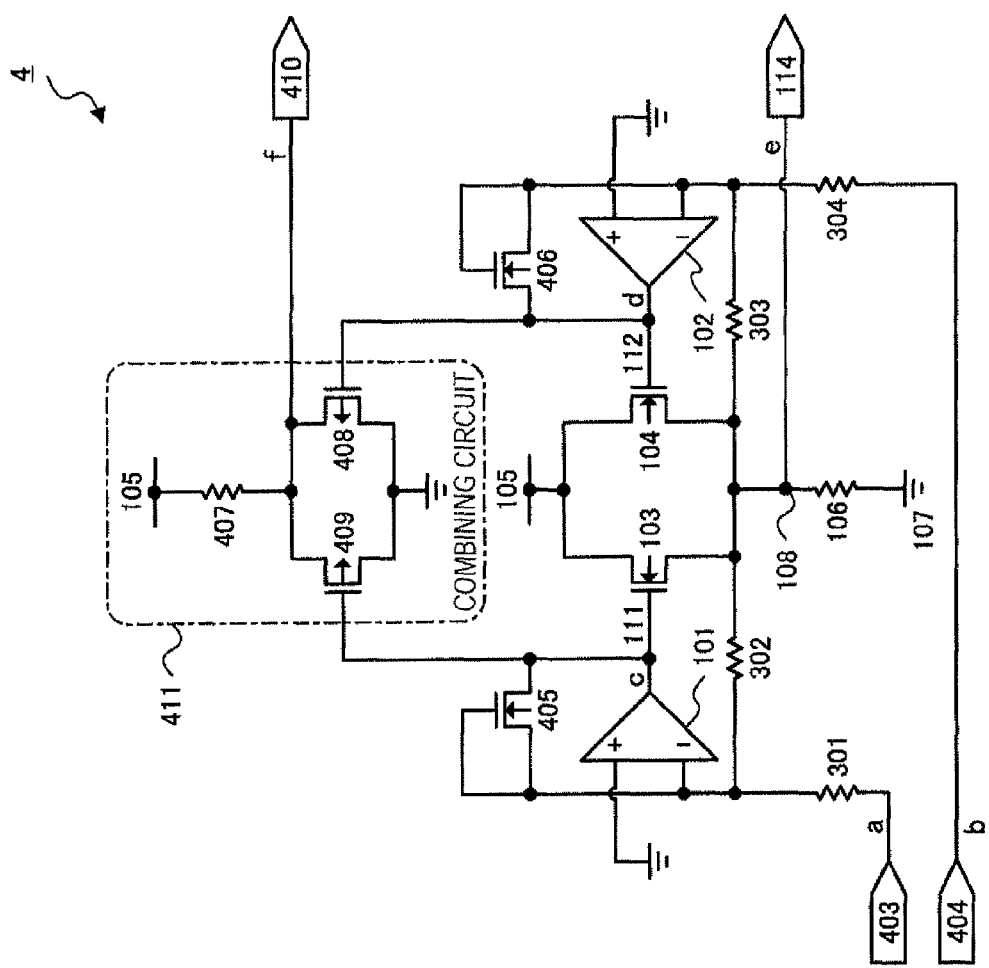
FIG. 4A
FIG. 4B

ELECTRONIC CIRCUIT AND ELECTRONIC DEVICE

BACKGROUND

1. Technical Field

The present invention relates to an electronic circuit and an electronic device, and more particularly to an electronic circuit, an electronic device, and the like which receive UWB (ultra wide band) signals.

2. Related Art

A circuit which detects an envelope of a received signal and demodulates a baseband signal has been used for a long time, and various types of such a circuit have been developed. The envelope corresponds to line connecting peak values, and is obtained by smoothing absolute values of alternating current components. Also, a method of squaring and smoothing a signal instead of envelope detection has been used for many years, and is currently called "square wave detection" or the like. For example, JP-A-4-170807 discloses a square detection circuit for obtaining squares of signals and a method of amplitude wave detection using the square detection circuit.

Moreover, a receiver conducting envelope detection is used in UWB communication by IR (impulse radio) using no carrier wave (hereinafter referred to as "UWB-IR" communication). This receiver has advantages shown in JP-A-2004-320083 and JP-A-2005-252740. The technologies disclosed in these references use a rectification circuit and an integration circuit to obtain envelope by smoothing absolute values of alternating current components of signals. The operation for detecting an envelope of modulated carrier waves (signals having high frequency and amplitude variable with time) is hereinafter referred to as "envelope detection". Currently, there is no example of UWB-IR receiver which uses square wave detection.

However, the square detection circuit according to JP-A-4-170807 uses bi-polar transistors, and does not contain MOS transistors appropriate for integrating large-scale circuits. Also, the square characteristics are approximated only when small signals having current variations sufficiently smaller than those of collector current are inputted, and thus errors are produced when large signals are inputted. For using large signals, the power consumption increases. Moreover, the operation speed of the circuit is not high and thus inappropriate for the structure which uses signals having high frequency close to the performance limit of the element like signals used in the UWB-IR communication. It is possible to perform envelope detection after decreasing frequency of signals by frequency conversion. In this case, however, highly accurate phase synchronization is necessary. When phase is not synchronized, errors of carrier wave frequency between transmission and reception are added to envelope of signals as beat. In this case, signals cannot be demodulated by frequency transformation.

Generally, the level of signals received by a receiver is variable according to receiving conditions. When the receiving signal level varies, signal detection by squares promotes the variations. More specifically, since the square detection uses output signals proportional to the square of the receiving signal level, the performance considerably lowers when the receiving signal level is low. Thus, detection of signal envelope by absolute values of signals is more advantageous than detection by squares.

The technologies disclosed in JP-A-2004-320083 and JP-A-2005-252740 detect UWB signals by absolute values of signals. However, both of the methods shown in these references propose only the principle of the UWB-IR communication, and does not show various problems which should be solved for practical use nor solutions for these problems.

Furthermore, the envelope detection circuit provided by the related-art technologies cannot effectively function for high frequency signals (steep and instant pulses) used in the UWB-IR communication.

JP-A-2004-320083 shows an example of circuit structure which includes a calculation amplifying circuit and an envelope detection circuit having PN junction diode. However, it is difficult to make the circuit having PN junction diode into one chip by CMOS semiconductor process, and it is almost impossible in the practical situation to execute full wave rectification for extremely thin pulses used for the UWB-IR communication and detect an envelope thereof.

While the UWB-IR communication uses high frequency close to the limit of element performance, the operable highest speed of the calculation amplifying circuit is only a fraction of the limit frequency of element performance. Thus, the operation speed is absolutely insufficient. Moreover, the related-art full wave rectification circuit does not operate in a preferable condition when input signals are not sufficiently large for the signal level received by the receiver. Furthermore, according to the full wave rectification circuit, it is almost impossible to detect signals having peak value of only several mV obtained by amplifying receiving signals received through an antenna by using a low-noise amplifying circuit disposed before the full wave rectification circuit in a preferable condition. Thus, methods such as increasing the degree of amplification of the low-noise amplifying circuit disposed before the full wave rectification circuit are required, but these methods produce various problems such as high frequency, complication of system, and increase in power consumption.

SUMMARY

It is an advantage of some aspects of the invention to provide an electronic circuit, an electronic device and the like capable of detecting absolute values of signals in high frequency band.

An electronic circuit according to a first aspect of the invention includes: a first amplifying circuit to which a first input signal is inputted; a second amplifying circuit to which a second input signal is inputted; a first drain ground amplifying transistor provided between a first power source node and an output node with control over the gate by the output from the first amplifying circuit; a second drain ground amplifying transistor provided between the first power source node and the output node with control over the gate by the output from the second amplifying circuit; a common load element provided between the output node and a second power source node; a first negative feedback path for negative feedback from the output node to the input of the first amplifying circuit; and a second negative feedback path for negative feedback from the output node to the input of the second amplifying circuit.

According to the electronic circuit in this aspect of the invention, the amplifying circuit is disposed before each of the two drain ground amplifying circuits for driving the common load element. These amplifying circuits receive negative feedback from the common load element driven by the drain ground amplifying circuits. In the structure including the two drain ground amplifying circuits for driving the common load element, the load is driven by one of the input values of the two drain ground amplifying circuits after comparison of the input levels of the two circuits. More specifically, when the drain ground amplifying circuits are constituted by N channel transistors, the outputs are driven by the input signal having higher voltage level in the input signals. However, when the drain ground amplifying circuits are constituted by P channel transistors, the outputs are driven by the input signal having lower voltage level. That is, the input signal having higher level or lower level is selectively amplified. In this case, the signal level absolute values are outputted when signals having opposite polarities are inputted as input signals, and thus full wave rectification can be achieved. Moreover, sufficient linearity and frequency characteristics can be provided by the drain ground amplifying circuits and the negative feedback paths. Since PN junction diode is not used, system on-chip can be achieved by ordinary CMOS semiconductor process. The circuit structure becomes extremely simple, and high-frequency and high-speed operation close to limit frequency of MOS transistor can be realized. Thus, the electronic circuit is applicable to a system requiring high-speed operation in UWB-IR communication or the like. Accordingly, the circuit (absolute value detecting circuit) capable of detecting absolute values of signals which are easily combined with a system is provided.

In this aspect of the invention, the electronic device may further include a combining circuit which combines an output signal from the first amplifying circuit and an output signal from the second amplifying circuit.

According to this structure, either the signal having higher input level or the signal having lower input level is amplified and outputted by driving the common load element using the drain ground amplifying circuits. As a result, the negative feedback path not selected is cut off, and the amplifying circuits output signals having large amplitudes. According to this electronic circuit, the output from the amplifying circuit having cut-off negative feedback path can be extracted and used by the combining circuit for combining the outputs from the first and second amplifying circuits. Thus, the large level signals produced by amplifying either the larger input signal or the smaller input signal (on the side of no output from the drain ground amplifying circuit) using the amplifying circuits (without feedback) can be used.

In the aspect of the invention, the combining circuit may be an adding circuit for adding voltage of the output signal from the first amplifying circuit and voltage of the output signal from the second amplifying circuit.

According to this structure, the combining circuit can be structured by a simple adding circuit. Thus, the signal level on the side of the connected negative feedback path can be added to the signal level on the side of the cut-off negative feedback path before output. Moreover, the design of the adding circuit has a sufficiently high degree of freedom for providing a variety of performances.

In the aspect of the invention, the combining circuit may output voltage corresponding to the voltage of the output signal from the amplifying circuit providing a smaller volume of feedback by the negative feedback control in the first and second amplifying circuits.

According to this structure, the circuit for combining the outputs of the amplifying circuits selects and outputs the output of the amplifying circuit having a smaller volume of feedback, that is, providing higher degree of amplitude. Thus, the signal having larger output level can be used.

In the aspect of the invention, the first amplifying circuit and the second amplifying circuit may be differential amplifying circuits.

According to this structure, the differential amplifying circuits are used as the amplifying circuits disposed before the drain ground amplifying circuits. Thus, fluctuations of the circuits such as offset can be reduced to the minimum. Moreover, the negative feedback path can be selected from various types, and thus feedback satisfying required circuit specifications such as linearity, frequency characteristics, and gains can be easily designed.

In the aspect of the invention, the first amplifying circuit and the second amplifying circuit may be inverter circuits.

According to this structure, CMOS inverter circuits or the like are used as the amplifying circuits disposed before the drain ground amplifying circuits. Thus, the circuit structure becomes extremely simple. Moreover, matching of frequency characteristics and the like can be easily achieved, and sufficient performance can be realized in many cases.

In the aspect of the invention, the first input signal and the second input signal may be signals having equal signal level absolute values with respect to predetermined voltage as reference and opposite signal level polarities with respect to predetermined voltage as reference.

According to this structure, the signals (balanced signals) having equal signal level absolute values with respect to the predetermined voltage as reference and opposite signal level polarities with respect to the predetermined voltage as reference are inputted to the electronic device. Then, the electronic device compares the levels of these signals and outputs the signal having higher level (when N channel transistor is used as drain ground amplifying circuit) or the signal having lower level (when P channel transistor is used as drain ground amplifying circuit). Thus, the absolute value of the signal level can be detected.

In the aspect of the invention, the electronic circuit may further include a clamp circuit which limits amplitudes of the respective output signals from the first amplifying circuit and the second amplifying circuit.

According to this structure, the first and second amplifying circuits do not output signals having large amplitudes. Thus, the frequency characteristics of the circuits, and particularly the through rate characteristics at the time of large signal input can considerably improve.

In the aspect of the invention, the negative feedback control may be performed via non-linear elements provided on the first negative feedback path and the second negative feedback path.

According to this structure, the linearity of the circuits can be intentionally distorted by incorporating the non-linear elements on the negative feedback paths. By this method, the circuit obtains functions of detecting squares of absolute values and automatically controlling gains as well as detection of absolute values.

An electronic device according to a second aspect of the invention includes the electronic device described above.

According to this structure, absolute values of signals can be easily detected by the electronic circuit. Thus, the simple and low power consumption type electronic device can be provided.

According to this aspect of the invention, the electronic device may further include a signal processing unit which detects a pulse signal from a received UWB (ultra wide band) signal.

According to this structure, absolute values of signals can be easily detected by the electronic circuit. Thus, the simple and low power consumption type electronic device particularly as a receiving device for detecting pulses carried on UWB signals can be provided. Particularly, preferable receiving characteristics can be obtained even when receiving signal level is low compared with a structure using square wave detection.

An electronic device according to a third aspect of the invention includes: a low-noise amplifying circuit to which a receiving signal is inputted; an absolute value detecting circuit as the electronic circuit described above to which the first input signal and the second input signal are inputted; a low pass filter to which the output from the absolute value detecting circuit is inputted; and a signal processing unit to which the output from the low pass filter is inputted.

According to this structure, absolute values of signals can be easily detected by the electronic circuit. Thus, the simple and low power consumption type electronic device as a receiving device using absolute value wave detection can be provided. Particularly, preferable receiving characteristics can be obtained even when receiving signal level is low compared with a structure using square wave detection.

In this aspect of the invention, a UWB (ultra wide band) signal may be inputted to the low-noise amplifying circuit as the receiving signal, and the signal processing unit detects a pulse signal from the UWB signal.

According to this structure, the simple and low power consumption type electronic device as a receiving device for detecting pulse carried on the UWB signal can be provided.

An electronic device according to a fourth aspect of the invention includes; a template signal generating unit which generates a first signal and a second signal orthogonal to each other; a first multiplier which outputs a first multiplication signal produced by multiplying the first signal by a receiving signal; a second multiplier which outputs a second multiplication signal produced by multiplying the second signal by the receiving signal; a first low pass filter which outputs a first low pass filter signal produced by removing a high frequency component from the first multiplication signal; a second low pass filter which outputs a second low pass filter signal produced by removing a high frequency component from the second multiplication signal; a first absolute value detecting circuit which outputs a signal level absolute value of the first low pass filter signal; a second absolute value detecting circuit which outputs a signal level absolute value of the second low pass filter signal; an adding circuit which adds a first absolute value output signal outputted from the first absolute value detecting circuit and a second absolute value output signal outputted from the second absolute value detecting circuit to output the added signal; and a judging circuit which judges the signal level of an addition output signal outputted from the adding circuit.

According to this structure, the receiving signal is multiplied by the two template signals (first signal and second signal) orthogonal to each other, that is, having phase difference of 90 degrees, and the high range is cut off by removing the high frequency component to obtain correlation values between the receiving signal and the templates. The sum of the squares of these correlation values correspond to the squares of the absolute value of the receiving signal. Thus, the absolute value of the receiving signal can be recognized.

In this aspect of the invention, the first absolute value detecting circuit includes: a first amplifying circuit to which a first input signal contained in the first low pass filter signal is inputted; a second amplifying circuit to which a second input signal contained in the first low pass filter signal is inputted; a first drain ground amplifying transistor provided between a first power source node and a first output node with control over the gate by the output from the first amplifying circuit; a second drain ground amplifying transistor provided between the first power source node and the first output node with control over the gate by the output from the second amplifying circuit; a first common load element provided between the first output node and a second power source node; a first negative feedback path for negative feedback from the first output node to the input of the first amplifying circuit; and a second negative feedback path for negative feedback from the first output node to the input of the second amplifying circuit. The second absolute value detecting circuit includes: a third amplifying circuit to which a third input signal contained in the second low pass filter signal is inputted; a fourth amplifying circuit to which a fourth input signal contained in the second low pass filter signal is inputted; a third drain ground amplifying transistor provided between the first power source node and a second output node with control over the gate by the output from the third amplifying circuit; a fourth drain ground amplifying transistor provided between the first power source node and the second output node with control over the gate by the output from the fourth amplifying circuit; a second common load element provided between the second output node and the second power source node; a third negative feedback path for negative feedback from the second output node to the input of the third amplifying circuit; and a fourth negative feedback path for negative feedback from the second output node to the input of the fourth amplifying circuit.

According to this structure, the receiving signal is multiplied by the two template signals (first signal and second signal) orthogonal to each other, that is, having phase difference of 90 degrees, and the high range is cut off by removing the high frequency component to obtain correlation values between the receiving signal and the templates. The sum of the squares of these correlation values correspond to the squares of the absolute value of the receiving signal. Thus, the absolute value of the receiving signal can be recognized. In this case, accurate synchronization with carrier waves of the receiving signal is not required. According to the electronic device described above, the sum of the absolute values is directly and easily obtained instead of the sum of squares of the correlation values. Since the sum of absolute values is used in place of the sum of squares, the receiving device capable of obtaining preferable receiving characteristics even when the receiving signal level is small can be easily produced.

BRIEF DESCRIPTION OF THE DRAWINGS

The invention will be described with reference to the accompanying drawings, wherein like numbers reference like elements.

FIGS. 4A and 4B show a third structure example and waveforms of an electronic circuit, respectively.

DESCRIPTION OF EXEMPLARY EMBODIMENT

A preferred embodiment according to the invention is hereinafter described in detail. However, the scope of the invention shown in the appended claims is not limited to this embodiment, and it is thus not required that all the structures shown in this embodiment are essential to solutions provided by the invention.

1. First Structure Example of Electronic Circuit

Figure 1A:
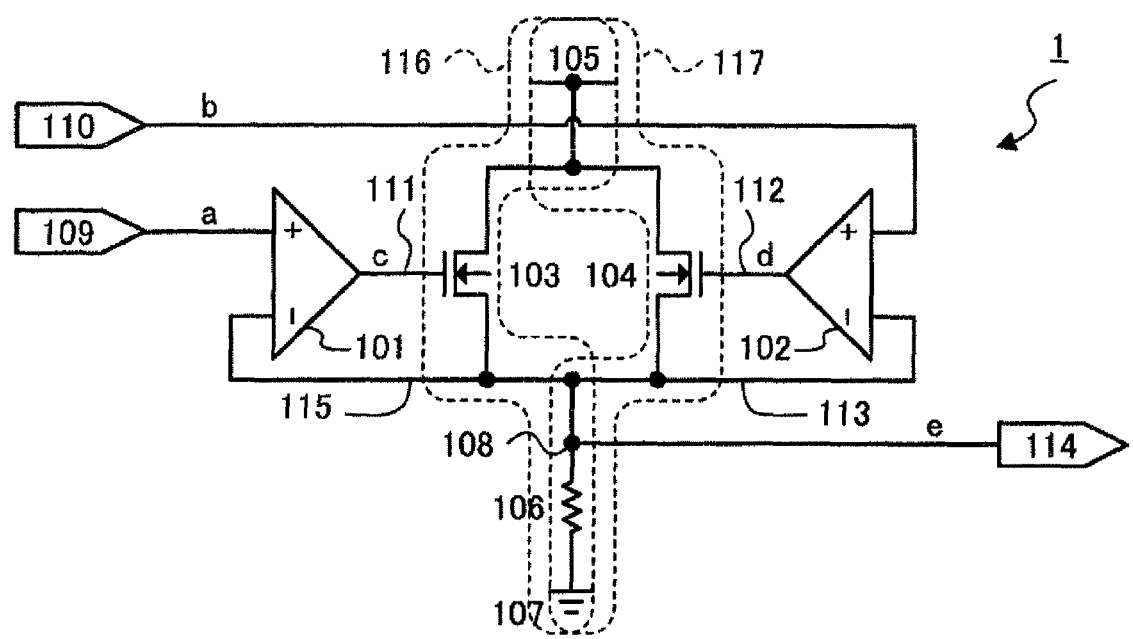
FIGS. 1A and 1B show a first structure example and waveforms of an electronic circuit, respectively.
Figure 1B:
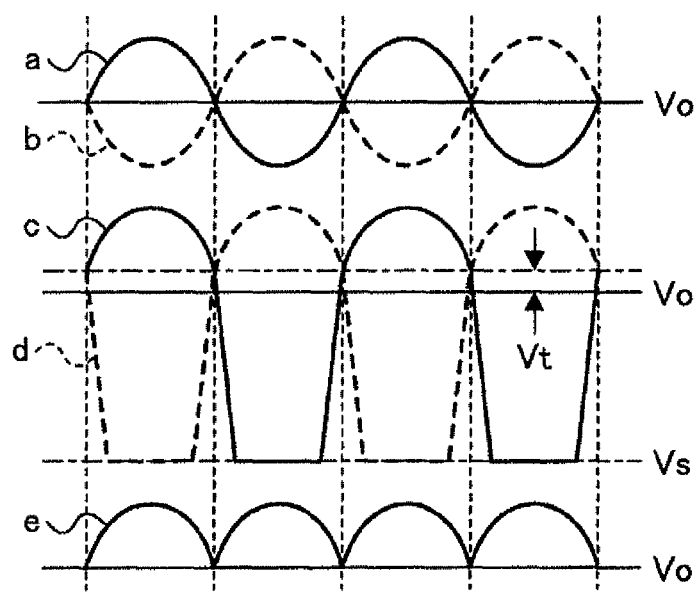
Figure 2:
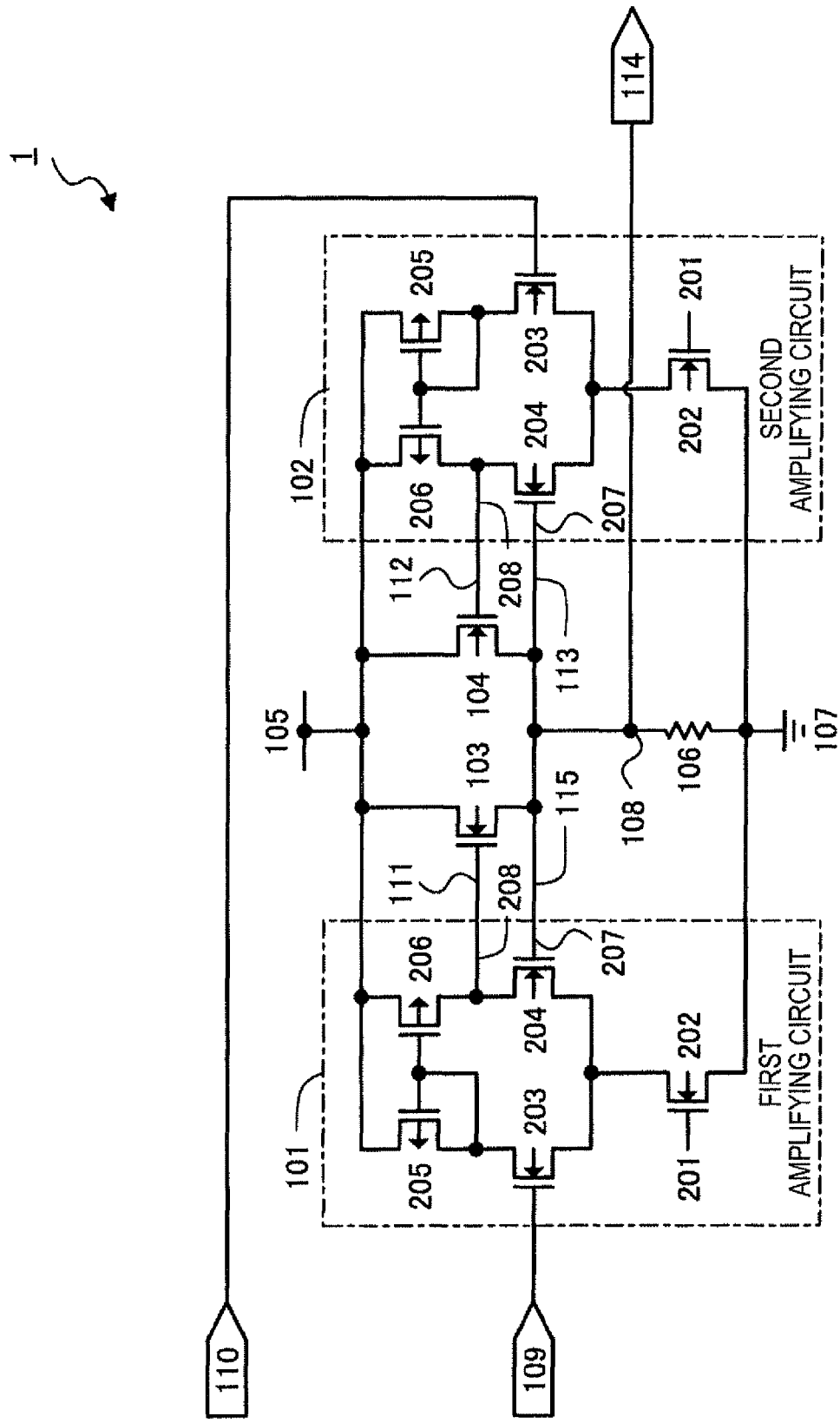
FIG. 2 illustrates a detailed structure example of an amplifying circuit.

Initially, a first structure example of an electronic circuit according to this embodiment is explained with reference to FIGS. 1A and 1B and FIG. 2. FIG. 1A is a circuit diagram showing the first structure example of the electronic circuit in this embodiment, and FIG. 1B is a waveform diagram showing the operation of the first structure example. FIG. 2 is a circuit diagram showing a detailed structure example of an amplifying circuit of the electronic circuit according to this embodiment.

The electronic circuit in this embodiment is not limited to the structure shown in FIGS. 1A and 1B and FIG. 2. It is thus intended that various modifications may be made by eliminating a part of the constituting elements, replacing these elements with other elements, adding other elements, or making other changes.

As illustrated in FIG. 1A, an electronic circuit 1 includes a first amplifying circuit 101 to which a first input signal is inputted, a second amplifying circuit 102 to which a second input signal is inputted, an NMOS transistor (first drain ground amplifying transistor) 103 and a resister (common load element in a wide sense) 106 constituting a first drain ground amplifying circuit 116, an NMOS transistor (second drain ground amplifying transistor) 104 and the resister 106 constituting a second drain ground amplifying circuit 117, a wire 115 as a first negative feedback path, and a wire 113 as a second negative feedback path.

The first drain ground amplifying transistor 103 is provided between a first power source node 105 and an output node 108, and the gate of the first drain ground amplifying transistor 103 is controlled by the output from the first amplifying circuit 101. The second drain ground amplifying transistor 104 is provided between the first power source node (VDD) 105 and the output node 108, and the gate of the second drain ground amplifying transistor 104 is controlled by the output from the second amplifying circuit 102.

The resistor (common load element) 106 is provided between the output node 108 and a second power source node (VSS) 107, and functions as a common load element for the first drain ground amplifying circuit 116 and the second drain ground amplifying circuit 117. Thus, the outputs from the first and second drain ground amplifying circuits are connected in parallel.

An output signal from the output node 108 as the outputs from the first and second drain ground amplifying circuits 116 and 117 is returned to the first amplifying circuit 101 and the second amplifying circuit 102 by negative feedback via the wires (first and second negative feedback paths) 115 and 113.

The plus pin and the minus pin of the first amplifying circuit 101 are connected with an input pin 109 and the wire 115, respectively, and the output pin of the first amplifying circuit 101 is connected with the gate of the NMOS transistor 103 via a wire 111. The plus pin and the minus pin of the second amplifying circuit 102 are connected with an input pin 110 and the wire 113, respectively, and the output pin of the second amplifying circuit 102 is connected with the gate of the NMOS transistor 104 via a wire 112.

The drain of the NMOS transistor 103 is connected with a power source voltage line (first power source node in a wide sense) 105, and the source of the NMOS transistor 103 is connected with the output node 108. The drain of the NMOS transistor 104 is connected with the power source voltage line 105, and the source of the NMOS transistor 104 is connected with the output node 108. The resistor 106 is connected between the output node 108 and a ground voltage line (second power source node in a wide sense) 107. The output node 108 is connected with the wires 113 and 115 and an output pin 114.

The electronic circuit 1 including the NMOS transistors 103 and 104 is a circuit which compares the levels of two input signals inputted to the input pins 109 and 110 to extract the input signal having higher level, and thus functions as an absolute value circuit for extracting absolute values of the two input signals. When the NMOS transistors 103 and 104 are constituted by PMOS transistors, the electronic circuit 1 compares the levels of the two input signals and extracts the input signal having lower level. It is possible to use junction type and electric field effective type transistors or bipolar transistors instead of the NMOS transistors 103 and 104.

The first input signal inputted to the input pin 109 is amplified by the first amplifying circuit 101 and inputted to the gate of the NMOS transistor 103. The second input signal inputted to the input pin 110 is amplified by the second amplifying circuit 102 and inputted to the gate of the NMOS transistor 104. Voltage at the common resistor 106 (voltage at output node 108) is returned to the input sides of the first amplifying circuit 101 and the second amplifying circuit 102 by negative feedback via the wire 115 and the wire 113.

When the first drain ground amplifying circuit 116 and the second drain ground amplifying circuit 117 drive the resistor 106 as the common load, the signal having higher voltage in the two input signals is amplified and appears at the resistor 106 as in this first structure example including the NMOS transistors 103 and 104. Thus, negative feedback loop is formed on the amplifying circuit 101 or 102 outputting higher voltage, and no negative feedback loop is formed on the amplifying circuit 101 or 102 outputting lower voltage and the voltage becomes further lower. As a result, the NMOS transistor 103 or 104 having no negative feedback loop is completely turned off.

In the case that the absolute values of the signal levels of the first and second input signals inputted to the input pins 109 and 110 are equal with respect to a predetermined reference level, and that the polarities of the signal levels are opposite with respect to a predetermined reference voltage, only the input signal having positive polarity or negative polarity appears at the output pin 114. Signals having equal signal level absolute values and opposite polarities are often used as balanced signals, and thus can be easily produced by known technology. When the first drain ground amplifying circuit 116 and the second drain ground amplifying circuit 117 are constituted by the NMOS transistors 103 and 104 as illustrated in FIG. 1A, only the positive side of the balanced type input signal is switched and outputted as both-wave rectification.

The operation of the electronic circuit 1 is now discussed with reference to the waveform diagram shown in FIG. 1B. The waveforms shown in FIG. 1B are produced when the first and second amplifying circuits 101 and 102 are constituted by ideal calculation amplifying circuits. In FIG. 1B, solid lines indicate signals associated with the first amplifying circuit 101, and broken lines indicate signals associated with the second amplifying circuit 102. First and second input signals a and b inputted to the input pins 109 and 110 are signals (balanced type signals) having equal signal level absolute values and opposite polarities with respect to a reference level Vo set at the center as shown in FIG. 1B. The first drain ground amplifying circuit 116 and the second drain ground amplifying circuit 117 for driving the common resistor 106 output voltage of the first amplifying circuit 101 or the second amplifying circuit 102 outputting higher voltage.

Thus, either an output signal c from the first amplifying circuit 101 or an output signal d from the second amplifying circuit 102 outputting higher voltage forms negative feedback loop achieving 100% feedback, and supplies voltage to the gates of the NMOS transistors 103 and 104 such that the degree of amplification becomes 1 as shown in FIG. 1B. More specifically, the output signal c from the first amplifying circuit 101 having received the positive polarity input signal a is outputted with voltage higher than the voltage of the input signal a by a threshold voltage Vt of the NMOS transistors 103 and 104. The output signal d from the second amplifying circuit 102 having received the negative polarity input signal b does not form negative feedback loop and thus outputs saturation voltage Vs of the second amplifying circuit 102. An output signal e outputted from the output pin 114 has voltage on the positive polarity side of the input signal a from the first amplifying circuit 101 or the input signal b from the second amplifying circuit 102 as shown in FIG. 1B.

FIG. 2 is a circuit diagram showing detailed structure examples of the first and second amplifying circuits 101 and 102 shown in FIG. 1A. The first and second amplifying circuits 101 and 102 according to this structure example are constituted by differential amplifying circuits.

NMOS transistors 203 and 204 form a differential pair. The input pin 109 corresponds to a differential non-inversion input pin, and an input pin 207 corresponds to a differential inversion input pin. An NMOS transistor 202 functions as a current source capable of keeping source current of the differential pair of the NMOS transistors 203 and 204 constant, and the current of the NMOS transistor 202 is determined by bias voltage applied to an input pin 201. PMOS transistors 205 and 206 are loads of the differential pair, and amplified differential signals are converted into a single output and outputted from an output pin 208.

The output pin 208 of the first amplifying circuit 101 is connected with the gate of the NMOS transistor 103, and the NMOS transistor 103 drives the common resistor 106. The signal outputted from the resistor 106 is inputted to an input pin 207 of the first amplifying circuit 101 and the input pin 207 of the second amplifying circuit 102 to form negative feedback paths. In this case, 100% negative feedback is formed on the output from the first amplifying circuit 101 or the second amplifying circuit 102 outputting higher voltage, and an amplification signal having no distortion is outputted to the output pin 114.

The first structure example of the electronic circuit having this structure provides the following advantages.

According to the electronic circuit 1 in this embodiment, all the elements can be easily produced by CMOS semiconductor integrated circuit process without using PN junction diode. Since signals to be outputted are signals on the side having the negative feedback loop, full wave rectification having a wide band and less distortion can be achieved. Furthermore, according to the structure shown in FIG. 2, accurate full wave rectification circuit having no distortion can be produced only by electric field effective type transistors without using PN junction diode.

2. Second Structure Example of Electronic Circuit

A second structure example of the electronic circuit is now discussed. According to the first structure example, the first and second amplifying circuits 101 and 102 are constituted by differential amplifying circuits. However, the differential type amplifying circuits 101 and 102 may have other various types of feedback and obtain different characteristics.

Figure 3A:
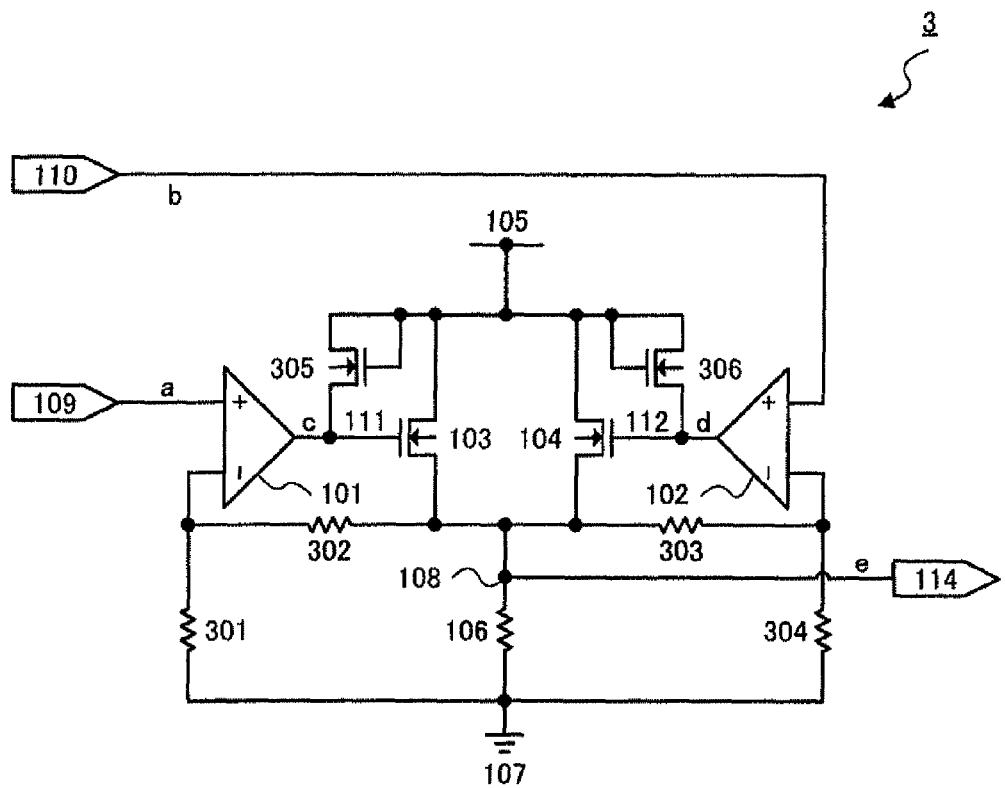
FIGS. 3A and 3B show a second structure example and waveforms of an electronic circuit, respectively.

FIG. 3A shows an amplifying circuit which obtains voltage gain by reducing feedback volume in the second structure example of the electronic circuit. The first and second amplifying circuits 101 and 102 of an electronic circuit 3 divide voltage for driving the common resistor (common load element in a wide sense) 106 by resistors 302 and 301 or resistors 303 and 304, and return the divided voltages to the minus pins of the first and second amplifying circuits 101 and 102 by negative feedback. In this example, each resistance value of the resistors 301 and 304 is R1, and each resistance value of the resistors 302 and 303 is R2. By this feedback, a signal (1+R2/R1) times larger than the signal having higher voltage in the input signals inputted to the input pins 109 and 110 appears at the output pin 114.

This structure example includes a clamp circuit for limiting the amplitude of each output signal from the first and second amplifying circuits 101 and 102. More specifically, NMOS transistors 305 and 306 constitute a clamp circuit for clamping output amplitude such that the amplitude does not become extremely large when voltage lower than the other voltage is inputted to the first and second amplifying circuits 101 and 102 (when negative feedback loop is not formed). By this method, the through rate characteristics of the first and second amplifying circuits 101 and 102 improve, and the operation speed increases.

Figure 3B:
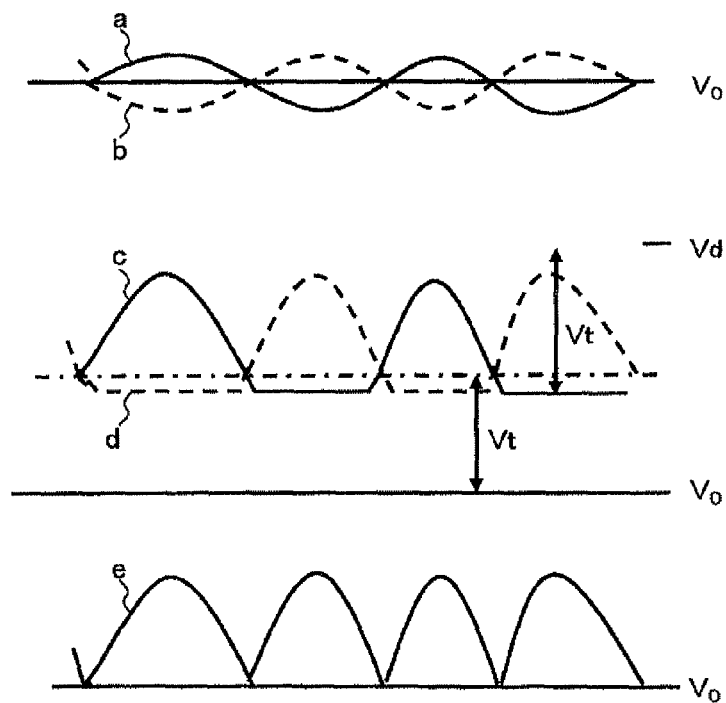

FIG. 3B is a waveform diagram showing the operation of the second structure example. The waveforms shown in FIG. 3B are produced when ideal calculation amplifying circuits are used as the first and second amplifying circuits 101 and 102. In FIG. 3B, solid lines indicate signals associated with the first amplifying circuit 101, and broken lines indicate signals associated with the second amplifying circuit 102. First and second input signals a and b inputted to the input pins 109 and 110 are signals (balanced type signals) having equal signal level absolute values and opposite polarities with respect to the reference level Vo at the center as shown in FIG. 3B.

As explained above, the first and second amplifying circuits 101 and 102 obtain voltage gains by reducing the feedback volume in this structure example. Thus, an output signal e (1+R2/R1) times larger than the signal having higher voltage level in the first and second input signals a and b can be produced.

Moreover, since this structure example includes the clamp circuit, the voltage levels of the output signals c and d from the first and second amplifying circuits 101 and 102 do not become lower than Vd−Vt (Vd: power source voltage, Vt: threshold voltage of transistors 305 and 306) as shown in FIG. 3B. By this method, the through rate characteristics of the first and second amplifying circuits 101 and 102 improve, and the operation speed increases.

3. Third Structure Example of Electronic Circuit

FIG. 4A shows a circuit for operating an amplifying circuit as a non-inversion amplifying circuit according to a third structure example of the electronic circuit. According to an electronic circuit 4, first and second input signals are inputted through input pins 403 and 404. The signal having lower voltage in these signals is inversely amplified by gain (−R2/R1) times, and appears at the output pin 114 (resistor of 301 and 304: R1, resistor of 302 and 303: R2). The input impedance of this circuit becomes R1, which is more effective when a circuit having low input impedance is needed than the structure shown in FIG. 3A.

NMOS transistors 405 and 406 are clamp circuits for improving the through rate characteristics when negative feedback paths are not formed on the first and second amplifying circuits 101 and 102. Negative feedback loops not formed on the resistors 302 and 303 can be formed by the NMOS transistors 405 and 406.

Thus, the first and second amplifying circuits 101 and 102 output voltage proportional to the square root of the higher voltage of the signals inputted to the input pins 403 and 404 (after inversion).

According to this structure example, the electronic circuit includes a combining circuit 411 for combining respective output signals from the first and second amplifying circuits 101 and 102. The combining circuit 411 is an adding circuit for adding voltage of the output signal from the first amplifying circuit 101 and voltage of the output signal from the second amplifying circuit 102. The combining circuit 411 outputs voltage corresponding to the voltage of the output signal from the amplifying circuit providing a smaller volume of feedback by negative feedback control in the first and second amplifying circuits 101 and 102.

More specifically, voltage proportional to the square root of the full wave rectification signal on the side opposite to the full wave rectification signal extracted from the output pin 114 can be extracted from an output pin 410 by extracting the output signal having lower output voltage using a drain ground amplifying circuit (combining circuit in a wide sense) 411 having two PMOS transistors 408 and 409 for driving a common resistor 407. Since the signal extracted from the output pin 410 is proportional to the square root of the absolute value of the input signal, the circuit provides a large dynamic range having smooth saturation characteristics even when the input signal level is high. Thus, the automatic gain control function can be added to the circuit as well as the rectification circuit function.

FIG. 4B is a waveform diagram showing the operation of the third structure example. The waveforms shown in FIG. 4B are produced when ideal calculation amplifying circuits are used as the first and second amplifying circuits 101 and 102. In FIG. 4B, solid lines indicate signals associated with the first amplifying circuit 101, and broken lines indicate signals associated with the second amplifying circuit 102. First and second input signals a and b inputted to the input pins 403 and 404 are signals (balanced type signals) having equal signal level absolute values and opposite polarities with respect to the reference level Vo at the center as shown in FIG. 4B.

As shown in FIG. 4B, the signal having lower voltage level in the first and second input signals a and b are inversely amplified by gain (–R2/R1) times, and outputted as an output signal e from the output pin 114. The signal having lower voltage level in the output signals c and d from the first and second amplifying circuits 101 and 102 is combined by the combining circuit 411, and outputted as an output signal f from the output pin 410.

In case that the automatic gain control function is unnecessary, or that sufficient through rate characteristics are secured, the NMOS transistors 405 and 406 can be eliminated. In this case, an absolute value signal amplified by open loop gain times of the amplifying circuits 101 and 102, that is, by extremely large gain can be extracted from the output pin 410.

The output signal of the logic level can be directly extracted from the output pin 410 by removing the NMOS transistors 405 and 406 and replacing the PMOS transistors 408 and 409 with NMOS transistors.

The absolute value signal outputted from the output pin 114 can obtain non-linear characteristics by replacing the resistors 302 and 303 or the resistors 301 and 304 provided on the first and second negative feedback paths with non-linear elements (such as electric field effective type transistors connecting drain and gate).

The third structure example of the electronic circuit having this structure can provide the following advantage.

According to this structure example, accurate full wave rectification circuit having no distortion can be provided only by using electric field effective type transistors without requiring PN junction diode.

4. Fourth Structure Example of Electronic Circuit

Figure 5:
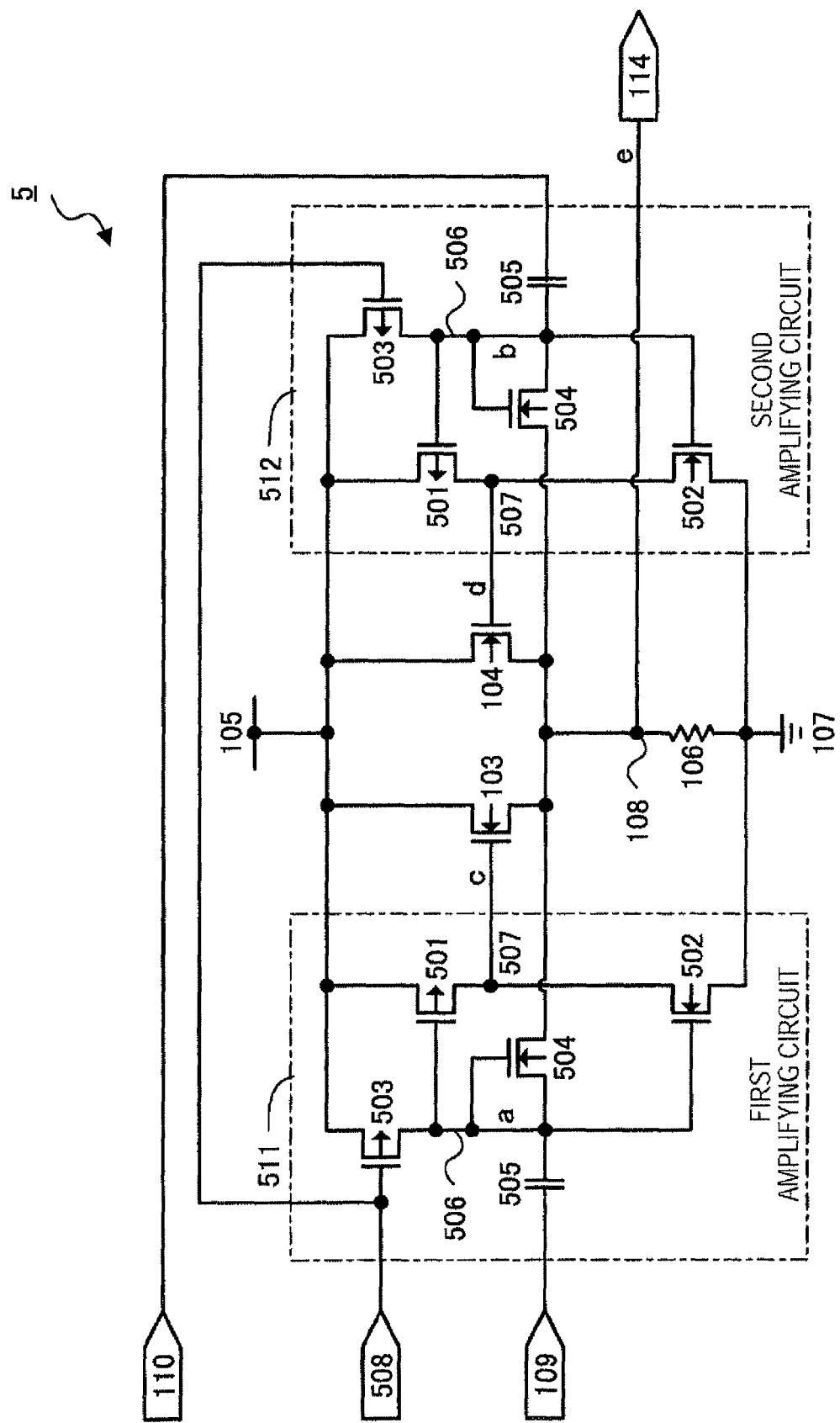
FIG. 5 shows a fourth structure example of an electronic circuit.

A fourth structure example of the electronic circuit is now discussed. FIG. 5 is a circuit diagram showing the fourth structure example of the electronic circuit. This structure example shows a structure including the first and second amplifying circuits 101 and 102 constituted by the most simplified CMOS inverters. In each of first and second amplifying circuits 511 and 512 of an electronic circuit 5, a PMOS transistor 501 and an NMOS transistor 502 constitute CMOS inverter. An NMOS transistor 504 forms negative feedback loop for feedback from the common resistor (common load element in a wide sense) 106 to the inputs of the first and second amplifying circuits 511 and 512. A PMOS transistor 503 is a current bias source for supplying small current to the NMOS transistor 504. Predetermined bias voltage is applied to the gate of the PMOS transistor 503 from an input pin 508.

During rest, that is, while input voltages to the input pins 109 and 110 are not varying, bias current supplied by the PMOS transistor 503 flows through the NMOS transistor 504 to the common resistor 106. At this time, current from the NMOS transistors 103 and 104 and bias current from the first and second amplifying circuits 511 and 512 flow to the resistor 106. When the bias current supplied by the PMOS transistor 503 is small, the potential difference between the output node 108 and a node 506 is approximately equivalent to the threshold voltage of the NMOS transistor 504 during rest. Also, the potential difference between the output node 108 and an output wire 507 of the first and second amplifying circuits 511 and 512 becomes equivalent to the threshold voltage of the NMOS transistors 103 and 104 by the function of the negative feedback provided by the NMOS transistor 504. By this method, the operation points of the first and second amplifying circuits 511 and 512 are set at the optimum voltage having large gain.

It is assumed that signals having equal signal level absolute values and opposite polarities are inputted to the input pins 109 and 110 of the first and second amplifying circuits 511 and 512.

When a signal having positive polarity is inputted to the input pin 109 of the first amplifying circuit 511, the signal is transmitted through a capacitor 505 to the node 506. Then, the signal is inversely amplified by the first amplifying circuit 511 to lower voltage at the output node 507 of the first amplifying circuit 511. At this time, a signal having negative polarity is inputted to the input pin 110 of the second amplifying circuit 512 to raise voltage at the output node 507 of the second amplifying circuit 512. As a result, the gate voltage of the NMOS transistor 104 becomes higher than the gate voltage of the NMOS transistor 103, and thus current supplied by the NMOS transistor 104 chiefly flows to the common resistor 106.

At this time, the potential difference between the node 507 and the node 506 of the first amplifying circuit 511 becomes lower than the threshold voltage of the NMOS transistor 504. Thus, the NMOS transistor 504 of the amplifying circuit 511 is turned off, and the negative feedback loop of the amplifying circuit 511 is cut off. As a result, the voltage at the output node 507 of the amplifying circuit 511 further lowers, and thus the NMOS transistor 103 is cut off. In this case, no current flows to the common resistor 106 through the NMOS transistor 103. More specifically, when a signal having positive polarity is inputted to the input pin 109 of the amplifying circuit 511, the NMOS transistor 104 is driven by the output signal from the amplifying circuit 512 to which a signal having the opposite sign is inputted. Also, current supplied by the NMOS transistor 104 flows to the common resistor 106.

On the contrary, when a signal having negative polarity is inputted to the input pin 109 of the first amplifying circuit 511, the signal is transmitted through the capacitor 505 to the node 506. Then, the signal is inversely amplified by the first amplifying circuit 511 to raise voltage at the output node 507 of the first amplifying circuit 511. At this time, a signal having positive polarity is inputted to the input pin 110 of the second amplifying circuit 512 to lower voltage at the output node 507 of the second amplifying circuit 512. As a result, the gate voltage of the NMOS transistor 103 becomes higher than the gate voltage of the NMOS transistor 104, and thus current supplied by the NMOS transistor 103 chiefly flows to the common resistor 106.

At this time, the potential difference between the node 507 and the node 506 of the second amplifying circuit 512 becomes lower than the threshold voltage of the NMOS transistor 504. Thus, the NMOS transistor 504 of the second amplifying circuit 512 is turned off, and the negative feedback loop of the second amplifying circuit 512 is cut off. As a result, the voltage at the output node 507 of the second amplifying circuit 512 further lowers, and thus the NMOS transistor 104 is cut off. In this case, no current flows to the common resistor 106 through the NMOS transistor 104. More specifically, when a signal having negative polarity is inputted to the input pin 109 of the first amplifying circuit 511, the NMOS transistor 103 is driven by the output signal from the first amplifying circuit 511. Also, current supplied by the NMOS transistor 103 flows to the common resistor 106.

More specifically, the signal having lower voltage (negative polarity) in the signals inputted to the input pins 109 and 110 of the first and second amplifying circuits 511 and 512 is inversely amplified according to the voltage amplification degrees of the first and second amplifying circuits 511 and 512 constituted by the COMS inverters, and outputted to the output pin 114. Thus, both wave rectification, that is, absolute value detection can be achieved.

Figure 6:
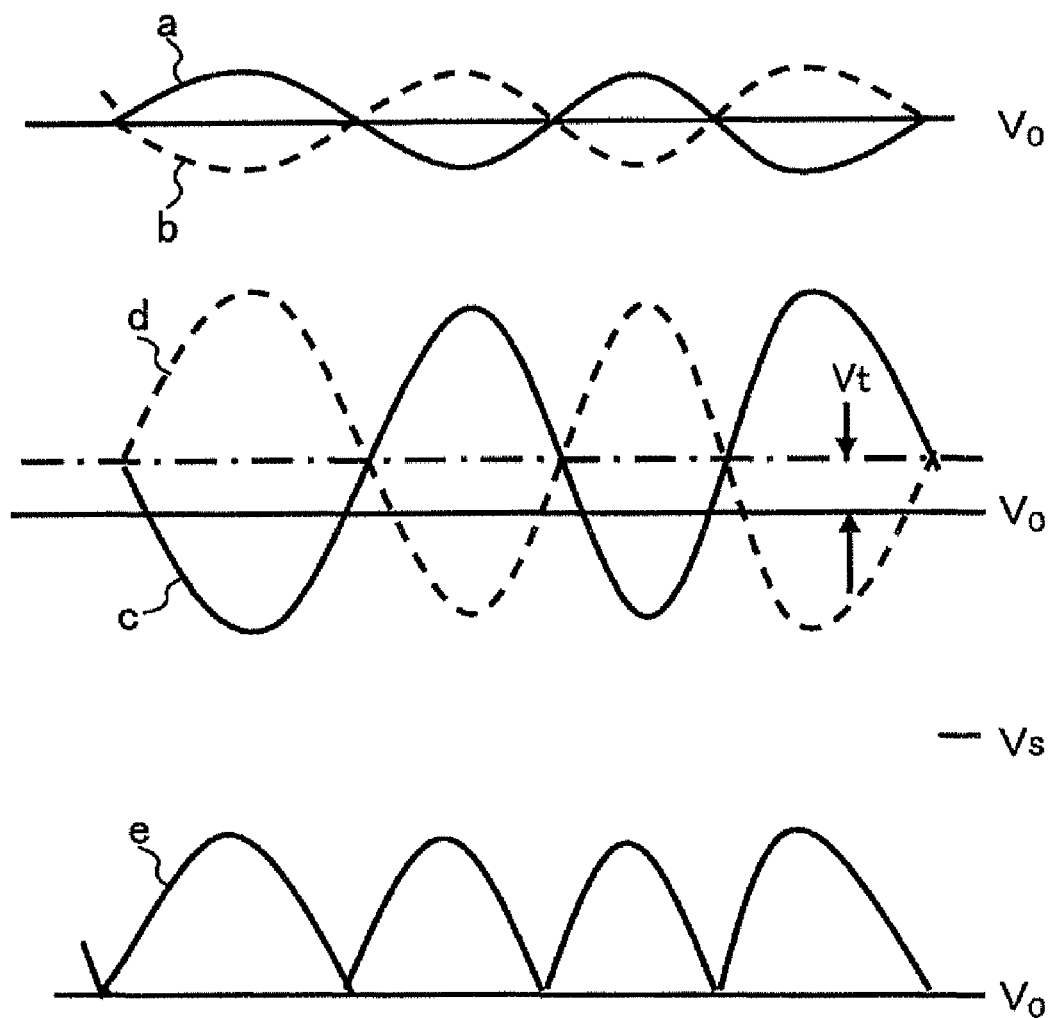
FIG. 6 shows waveforms of the fourth structure example of the electronic circuit.

FIG. 6 is a waveform diagram showing the operation of the fourth structure example. In FIG. 6, solid lines indicate signals associated with the first amplifying circuit 501, and broken lines indicate signals associated with the second amplifying circuit 502. Signals a and b are signals at the nodes 506 of the first and second amplifying circuits 511 and 512. Signals c and d are output signals from the first and second amplifying circuits 511 and 512. A signal e is a signal at the output node 108 (output pin 114).

As discussed above, the potential difference between the signal e at the output node 108 and the output signals c and d from the first and second amplifying circuits 511 and 512 becomes approximately equivalent to the threshold voltage Vt of the NMOS transistors 103 and 104. The output signal e is a signal produced by inversely amplifying the signal having lower voltage level (negative polarity side) in the signals inputted to the input pins 109 and 110.

According to this structure, the absolute value detection (full wave rectification) circuit having less distortion and amplified gain can be provided only by using electric field effective type transistors without requiring PN junction diode. The amplifying circuit constituted by CMOS inverter has simplified structure and operates at high speed. Thus, the circuit capable of operating at extremely high speed and reducing distortion compared with those of the related-art rectifying circuit can be provided.

5. First Structure Example of Electronic Device

Figure 7:
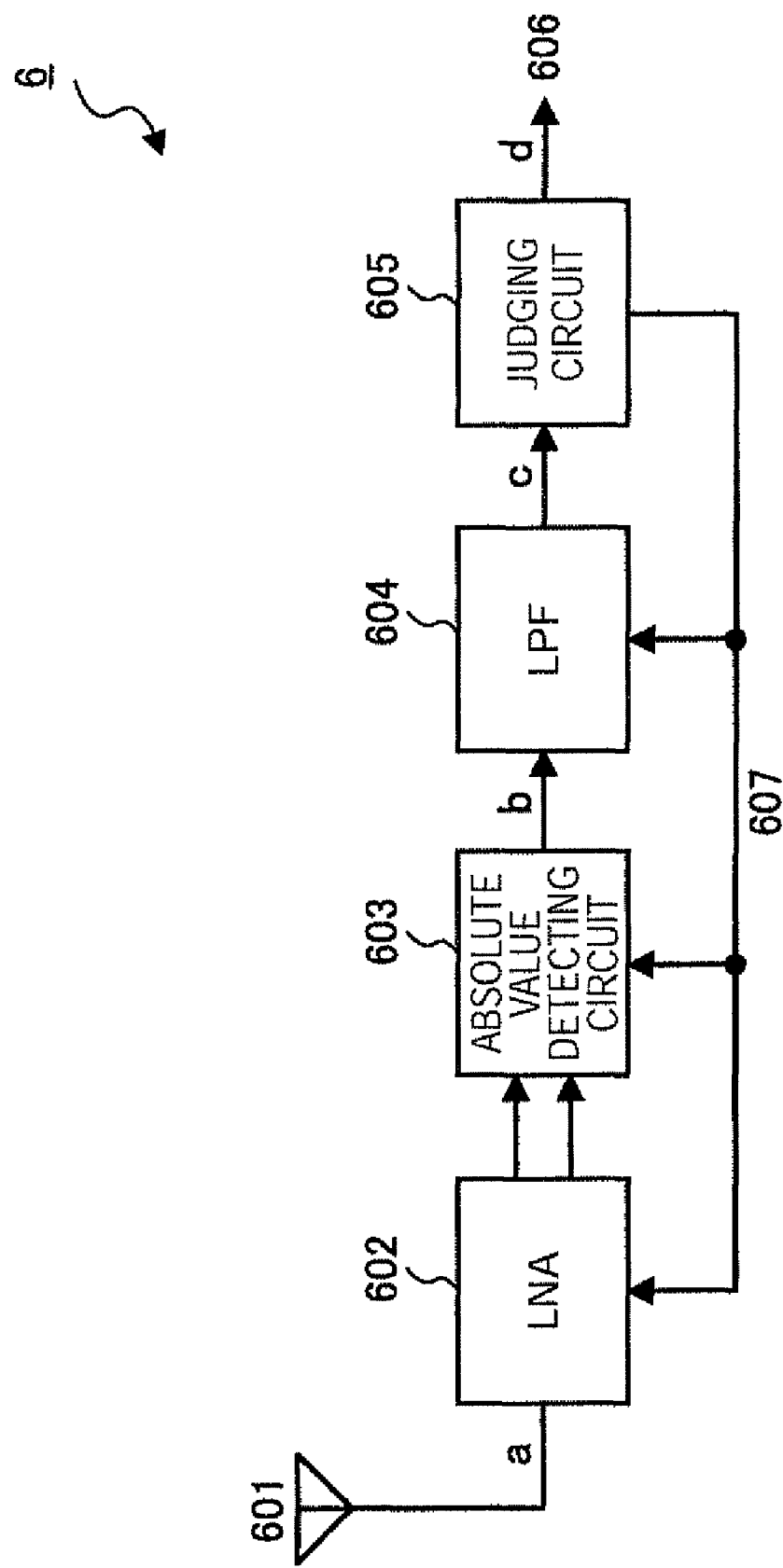
FIG. 7 shows a first structure example of a receiving device.
Figure 8:
FIG. 8 shows waveforms of the first structure example of the receiving device.

A first structure example of an electronic device (receiving device) including the electronic circuit according to this embodiment is now discussed with reference to FIGS. 7 and 8. FIG. 7 is a circuit diagram showing the first structure example of the receiving device. FIG. 8 is a waveform diagram showing the operation of this structure example.

As shown in FIG. 7, a receiving device 6 includes an antenna 601, a low noise amplifying circuit (LNA: low noise amplifier) 602 inputting receiving signals, an absolute value detecting circuit 603 as the electronic circuit shown in FIGS. 1A through 6, a low pass filter (LPF) 604, a judging circuit 605 as a signal processing unit for detecting pulse signals from received UWB (ultra wide band) signals.

A receiving signal a received by the antenna 601 (FIG. 7) is amplified by the LNA 602, and then converted into two balanced signals (differential signals) having equal signal level absolute values and opposite polarities. These signals can be easily produced by BALUN (balance/unbalance converter) and differential amplifying circuit.

The absolute value detecting circuit 603 performs full wave rectification for the first input signal and second input signal (balanced signals) constituting the output signal of the LNA 602 to output full wave rectification signal b (FIG. 8). The electronic circuit described above can be used as a specific example of the absolute value detecting circuit 603. The LPF 604 removes high frequency component of the full wave rectification signal b to output LPF signal c (FIG. 8). The LPF 604 may be constituted by an integrating circuit. The judging circuit 605 judges voltage level of the LPF signal c (binary process) and outputs binary signal d (FIG. 8) from an output pin 606 to detect presence or absence of pulse.

According to the UWB-IR communication, modulation system called OOK (on-off-keying) is performed when transmission and non-transmission of pulse is controlled based on bit 1/0 of transmitted information. On the other hand, modulation system called PPM (pulse position modulation) is performed when pulse position is controlled based on transmission bit information. The receiving device 6 having this structure can detect presence or absence of transmitted pulse or pulse position, thereby achieving demodulation of UWB-IR.

The judging circuit 605 also has function of controlling the overall components of the receiving device 6. More specifically, the judging circuit 605 starts the LNA 602, the absolute value detecting circuit 603, and the LPF 604 in response to a control signal 607 issued when receiving the UWB signal. According to the UWB-IR communication, power consumed by the receiving device 6 can be reduced by deactivating the LNA 602, the absolute value detecting circuit 603, and the LPF 604 when no signal exists.

According to the first structure example of the electronic device, the UWB-IR receiving device can be constructed by a simple structure without requiring complicated processes such as synchronous capturing and synchronous tracking by synchronous wave detection. Thus, the power consumption and cost of the device can be reduced.

6. Second Structure Example of Electronic Device

Figure 9:
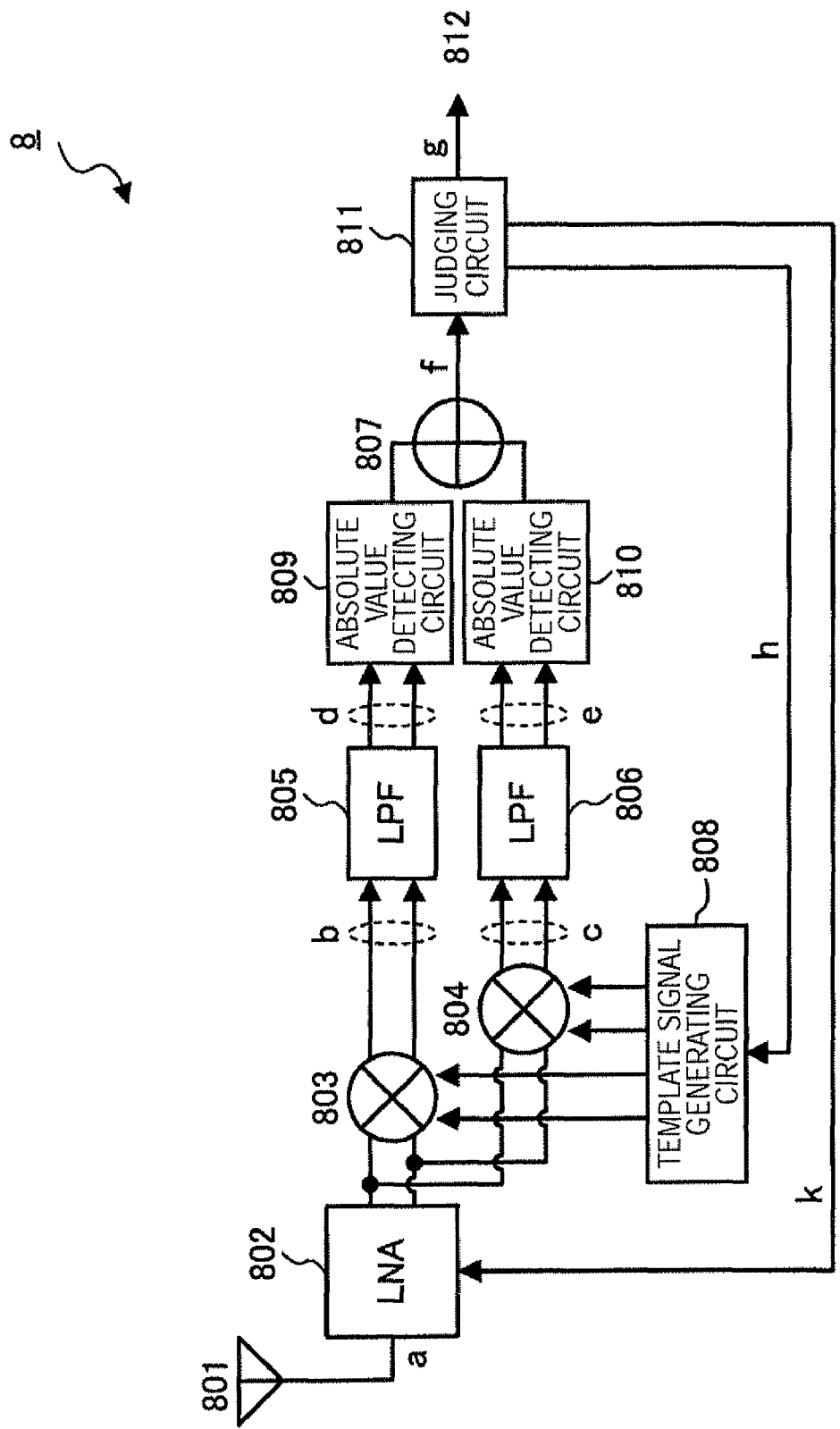
FIG. 9 shows a second structure example of a receiving device.
Figure 10:
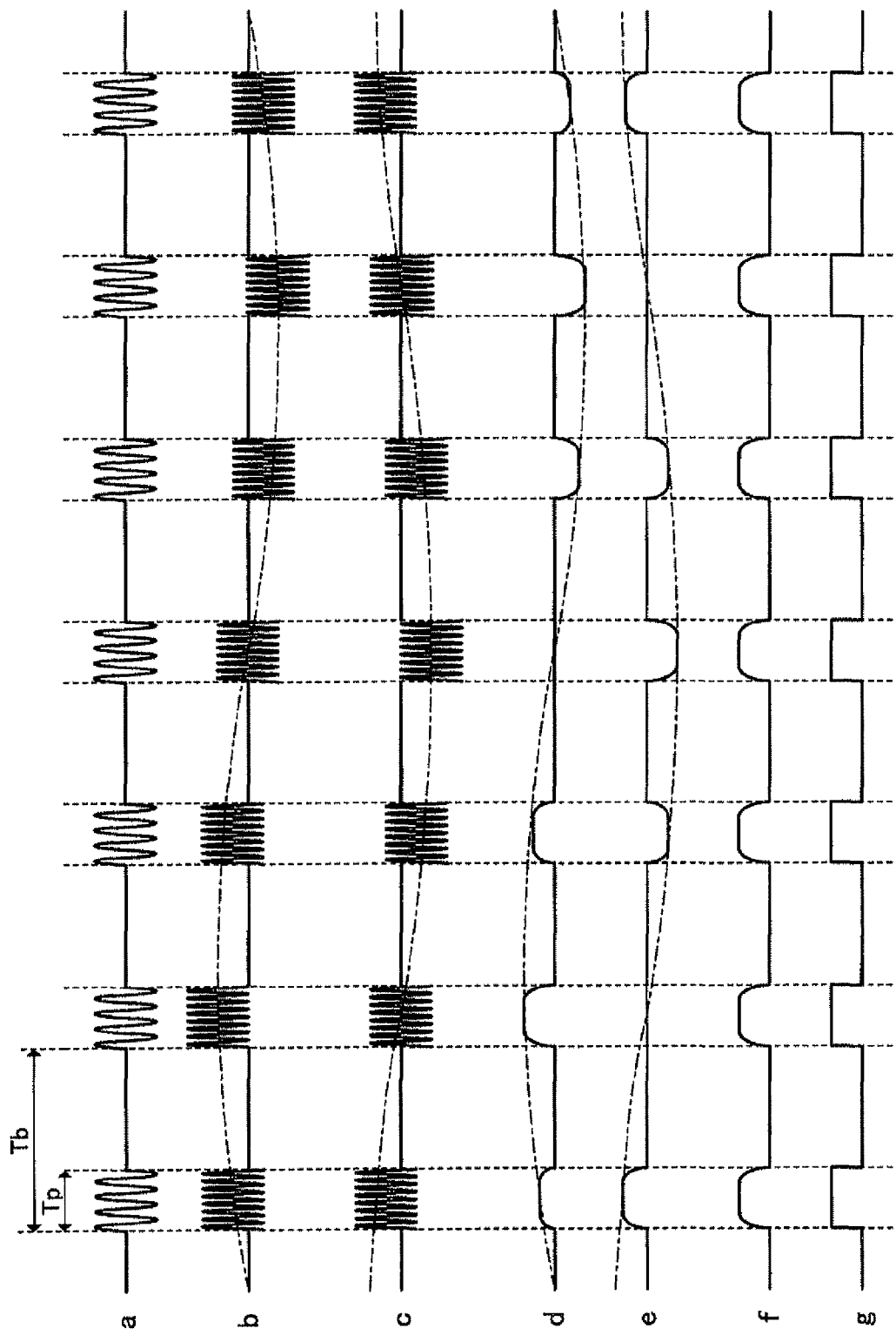
FIG. 10 shows waveforms of the second structure example of the receiving device.

A second structure example of the electronic device (receiving device) is now discussed with reference to FIGS. 9 and 10. FIG. 9 is a circuit diagram showing the second structure example of the electronic device (receiving device). FIG. 10 is a waveform diagram showing the operation of this structure example.

As shown in FIG. 9, a receiving device 8 includes an antenna 801, an LNA 802, first and second mixers (multipliers) 803 and 804, first and second LPFs (low pass filters) 805 and 806, first and second absolute value detecting circuits 809 and 810 as electronic circuits, a template signal generating circuit (template signal generating unit in a wide sense) 808, an adding circuit 807, and a judging circuit 811.

A UWB signal a received by the antenna 801 is amplified by the LNA 802, and then converted into two balanced signals (differential signals) having equal signal level absolute values and opposite polarities. The balanced signals can be easily produced by BALUN (balance/unbalance converter) and differential amplifying circuit.

The first and second mixers (multipliers) 803 and 804 output first and second multiplication signals b and c produced by multiplying the balanced signals (receiving signals) by first and second signals (template signals) generated by the template signal generating circuit 808. The template signal generating circuit 808 generates the first and second signals (template signals) orthogonal to each other, that is, having phase difference of 90 degrees between the first and second signals. The template signal of the receiving device 8 generally has slight error as deviation from the UWB signal transmitted by a transmitting device (not shown). When this slight error is not corrected by a phase fixing loop or the like, the polarities of the first and second multiplication signals b and c multiplied using the first and second mixers (multipliers) 803 and 804 vary between the positive and negative sides as signal output level variations with the cycle corresponding to the error of the template signal between transmission and reception as shown in FIG. 10. When either the first or the second multiplication signals b and c (other than high range) outputted from the first and second mixers (multipliers) 803 and 804 is the maximum or the minimum under the condition that the first and second signals (template signals) generated by the template signal generating circuit 808 are orthogonal to each other, that is, the phase difference is 90 degrees, the other of the multiplication signals b and c becomes zero.

The first and second multiplication signals b and c outputted from the first and second mixers (multipliers) 803 and 804 become first and second LPF signals (low pass filter signals) d and e from which the high ranges are removed by the LPF 805 and 806. When either the first or the second signal (template signal) generated by the template signal generating circuit 808 is the maximum or the minimum under the condition that the phase difference between these template signals is 90 degrees, the other of the template signals becomes zero.

It is possible to obtain demodulation data having constant amplitude by calculating the sum of squares of the two LPF signals d and e. However, this structure example uses the method of obtaining the absolute values of the signals by full wave rectification instead of calculation of the sum of squares, and adding the absolute values. In this case, the amplitude of the signals does not become constant by addition of absolute values, but problem scarcely occurs due to binary processing in many cases. In case of calculation of the sum of squares, the process of squaring produces extremely small output signals when signals are small. Thus, the method according to this structure example is more effective.

For this reason, the absolute values of the first and second LPF signals d and e outputted from the LPF 805 and 806 are detected by the first and second absolute value detecting circuit 809 and 810, and added by the adding circuit 807 to become an addition signal f. Then, the voltage level of the addition signal f is judged by the judging circuit 811 (that is, binary process) to be outputted as demodulation data g from an output pin 812. The first and second absolute value detecting circuits 809 and 810 are constituted by the electronic circuits (FIG. 1A through FIG. 6) according to this embodiment.

The first absolute value detecting circuit 809 includes the first and second amplifying circuits 101 and 102 to which the first and second input signals constituting the first low pass filter signal are inputted as illustrated in FIG. 1A, for example. The first absolute value detecting circuit 809 further includes the first drain ground amplifying transistor 103 provided between the first power source node and the first output node 108 with control over the gate by the output of the first amplifying circuit 101. The first absolute value detecting circuit 809 further includes the second drain ground amplifying transistor 104 provided between the first power source node 105 and the first output node 108 with control over the gate by the output of the second amplifying circuit 102. The first absolute value detecting circuit 809 further includes the first common load element 106 provided between the first output node 108 and the second power source node. The first absolute value detecting circuit 809 further includes the first negative feedback path 115 for negative feedback from the first output node 108 to the input of the first amplifying circuit 101 and the second negative feedback path 113 for negative feedback from the first output node 108 to the input of the second amplifying circuit 102.

The second absolute value detecting circuit 810 is constituted by the electronic circuit having the same structure as that of the first absolute value detecting circuit 809. More specifically, the second absolute value detecting circuit 810 includes third and fourth amplifying circuits, third and fourth drain ground amplifying transistors, a second common load element, and third and fourth negative feedback paths. Though not shown in the figure, the third and fourth amplifying circuits correspond to the first and second amplifying circuits 101 and 102 described above, and the third and fourth drain ground amplifying transistors correspond to the first and second drain ground amplifying transistors 103 and 104 described above. The second common load element corresponds to the first common load element 106 described above, and the third and fourth negative feedback paths correspond to the first and second negative feedback paths 115 and 113 described above.

The judging circuit 811 also has function of controlling the overall components of the receiving device 8. More specifically, the judging circuit 811 starts the template signal generating circuit 808 by a control signal h (not shown in FIG. 10) when receiving the UWB signal, and activates the LNA 802 by a control signal k (not shown in FIG. 10). Signals used in the UWB-IR communication are intermittent signals, and thus power consumed by the receiving device 8 can be reduced by deactivating the LNA 802 while signals are absent.

The first and second multiplication signals b and c and the first and second LPF signals (low pass filter signals) d and e are constituted by signals (balanced signals) having equal signal level absolute values with respect to predetermined voltage as reference and opposite signal level polarities with respect to the predetermined voltage as reference.

According to the second structure example of the electronic device described above, the frequency component of the signal inputted to the absolute value detecting circuit is lower than that of the first structure example. Thus, the absolute value detecting circuit can be more easily produced. Particularly for demodulation of UWB signals using high frequency close to the limit of the element, the absolute value detecting circuit can be easily manufactured.

The receiving device 8 having this structure example for the UWB-IR communication can demodulate UWB signals by OOK or PPM. The template signal generating circuit 808 does not particularly need to correct errors of template signals between transmission and reception, and thus the process and structure required for reception can be further simplified.

Accordingly, the structure of the receiving device 8 can be considerably simplified by using the electronic circuit in this embodiment.

It is easily understood for the person skilled in the art that the invention is not limited to the embodiment described and depicted in detail herein, and that many modifications and changes may be made without practically departing from the inventive matters and effects of the invention. Thus, all the modified examples are contained in the scope of the appended claims. For example, terms described in connection with different terms in wider or identical senses at least once can be replaced with those different terms in any section of the specification or drawings. The structure and operation of the electronic circuit and electronic device are not limited to those shown in this embodiment, but may be modified in various ways.

The entire disclosure of Japanese Patent Application Nos. 2008-121929 filed on May 8, 2008 and 2009-066742 filed on Mar. 18, 2009 are expressly incorporated by reference herein.

What is claimed is:

1. An electronic circuit comprising:
    a first amplifying circuit to which a first input signal is inputted;
    a second amplifying circuit to which a second input signal is inputted;
    a first drain ground amplifying transistor provided between a first power source node and an output node with control over the gate by the output from the first amplifying circuit;
    a second drain ground amplifying transistor provided between the first power source node and the output node with control over the gate by the output from the second amplifying circuit;
    a common load element provided between the output node and a second power source node;
    a first negative feedback path for negative feedback from the output node to the input of the first amplifying circuit;
    a second negative feedback path for negative feedback from the output node to the input of the second amplifying circuit; and
    a combining circuit which combines an output signal from the first amplifying circuit and an output signal from the second amplifying circuit,
    wherein the combining circuit outputs voltage corresponding to the voltage of the output signal from the amplifying circuit providing a smaller volume of feedback by the negative feedback control in the first and second amplifying circuits.

2. The electronic circuit according to claim 1, wherein the combining circuit is an adding circuit for adding voltage of the output signal from the first amplifying circuit and voltage of the output signal from the second amplifying circuit.

3. The electronic circuit according to claim 1, wherein the first amplifying circuit and the second amplifying circuit are differential amplifying circuits.

4. The electronic circuit according to claim 1, wherein the first amplifying circuit and the second amplifying circuit are inverter circuits.

5. The electronic circuit according to claim 1, wherein the first input signal and the second input signal are signals having equal signal level absolute values with respect to predetermined volume as reference and opposite signal level polarities with respect to predetermined voltage as reference.

6. An electronic circuit comprising:
    a first amplifying circuit to which a first input signal is inputted;
    a second amplifying circuit to which a second input signal is inputted;
    a first drain ground amplifying transistor provided between a first power source node and an output node with control over the gate by the output from the first amplifying circuit;
    a second drain ground amplifying transistor provided between the first power source node and the output node with control over the gate by the output from the second amplifying circuit;
    a common load element provided between the output node and a second power source node;
    a first negative feedback path for negative feedback from the output node to the input of the first amplifying circuit;
    a second negative feedback path for negative feedback from the output node to the input of the second amplifying circuit; and
    a clamp circuit which limits amplitudes of the respective output signals from the first amplifying circuit and the second amplifying circuit.

7. The electronic circuit according to claim 1, wherein the negative feedback control is performed via non-linear elements provided on the first negative feedback path and the second negative feedback path.

8. An electronic device comprising:
    a low-noise amplifying circuit to which a receiving signal is inputted;
    an absolute value detecting circuit as an electronic circuit to which a first input signal and a second input signal having an output signal of the low-noise amplifying circuit are inputted;
    a low pass filter to which an output from the absolute value detecting circuit is inputted; and
    a signal processing unit to which an output from the low pass filter is inputted, the electronic circuit comprising:
    a first amplifying circuit to which the first input signal is inputted;
    a second amplifying circuit to which the second input signal is inputted;
    a first drain ground amplifying transistor provided between a first power source node and an output node with control over the gate by the output from the first amplifying circuit;
    a second drain ground amplifying transistor provided between the first power source node and the output node with control over the gate by the output from the second amplifying circuit;

a common load element provided between the output node and a second power source node;
a first negative feedback path for negative feedback from the output node to the input of the first amplifying circuit; and a second negative feedback path for negative feedback from the output node to the input of the second amplifying circuit.

* * * * *